(12) United States Patent
Patelzick

(10) Patent No.: US 7,891,981 B1
(45) Date of Patent: Feb. 22, 2011

(54) SYSTEM FOR MAINTAINING A PRINTED CIRCUIT BOARD IN AN ENCLOSURE

(75) Inventor: Dana L. Patelzick, West Linn, OR (US)

(73) Assignee: CyberOptics Semiconductor, Inc., Beaverton, OR (US)

( * ) Notice: Subject to any disclaimer, the term of this patent is extended or adjusted under 35 U.S.C. 154(b) by 306 days.

(21) Appl. No.: 11/824,706

(22) Filed: Jul. 2, 2007

Related U.S. Application Data

(60) Provisional application No. 60/818,710, filed on Jul. 5, 2006.

(51) Int. Cl.
*H01R 12/00* (2006.01)
(52) U.S. Cl. ............... 439/66; 361/742; 174/138 G
(58) Field of Classification Search ............... 439/66, 439/74; 361/742, 752, 757, 758; 174/138 G, 174/138 D
See application file for complete search history.

(56) References Cited

U.S. PATENT DOCUMENTS

| 5,201,451 | A * | 4/1993 | Desai et al. | 228/5.5 |
| 6,188,583 | B1 * | 2/2001 | Fendt et al. | 361/796 |
| 6,875,921 | B1 * | 4/2005 | Conn | 174/534 |
| 6,906,266 | B2 * | 6/2005 | Verrigni | 174/138 G |

* cited by examiner

*Primary Examiner*—Xuong M Chung Trans
(74) *Attorney, Agent, or Firm*—Christopher R. Christenson; Westman, Champlin & Kelly, P.A.

(57) ABSTRACT

A system for maintaining a printed circuit board in an enclosure includes at least one interposer. The circuit board and housing are coupled to one or more interposers. The interposer(s) fixedly couples to both the circuit board and the enclosure, and allows the circuit board and enclosure to maintain alignment during thermal heat expansion along a desired axis, such as between the center of the board and housing.

12 Claims, 4 Drawing Sheets

US 7,891,981 B1

SYSTEM FOR MAINTAINING A PRINTED CIRCUIT BOARD IN AN ENCLOSURE

CROSS-REFERENCE TO RELATED APPLICATION

The present application is based on and claims the benefit of U.S. provisional patent application Ser. No. 60/818,710, filed Jul. 5, 2006, the content of which is hereby incorporated by reference in its entirety.

COPYRIGHT RESERVATION

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

Circuit boards are widely used to mechanically support and electrically connect electronic components. Circuit boards are generally rugged, inexpensive and can be highly reliable. Their dependable qualities have lead to their use in most electronic goods and in devices ranging from computers to lasers.

Circuit boards are generally placed in environments where the temperature will fluctuate. When its environment is hotter the circuit board will expand. Conversely, in colder environments the circuit board will contract. The degree to which the circuit board undergoes dimensional change in response to temperature is known as the Coefficient of Thermal Expansion (CTE).

Different materials have different CTE's and react to temperature changes differently. The degree to which a circuit board expands in hotter temperatures, will generally be different than that of its surrounding elements, including its housing. This can lead to relative movement between the circuit board and its housing. However in some cases the alignment between different components of a machine may be very important. For example in some applications, the center of the circuit board may need to be aligned with the center of the housing for optimal use.

Floating fasteners in conjunction with a fixed fastener were used in the past to prevent relative movement between a circuit board and its enclosure at a single point. The fixed fastener, such as a screw or a weld, was used at the single point to ensure that there was no relative movement at that location. Spacers (floating fasteners) were placed along other points to allow relative movement at other points.

Although floating fastener-based approaches to mounting circuit boards have been proven effective, they can only allow for coupling at the point of alignment such as the center of the circuit board and the housing. Floating fastener-based approaches do not allow for other coupling options at different points of the circuit board or housing. Furthermore when thermal expansion occurs, the circuit board and housing sometimes rub against each other and against the spacers which hold them apart. This rubbing can produce wear and contamination causing debris. This can damage the circuit board and hinder the performance of the overall device. The circuit board and housing also run the risk of sticking or binding together. This can lead to component or device distortion resulting in less than optimal use.

SUMMARY

A system for maintaining a printed circuit board in an enclosure includes at least one interposer. The circuit board and housing are coupled to one or more interposers. The interposer(s) fixedly couples to both the circuit board and the enclosure, and allows the circuit board and enclosure to maintain alignment during thermal heat expansion along a desired axis, such as between the center of the board and housing.

DETAILED DESCRIPTION OF ILLUSTRATIVE EMBODIMENTS

Figure 1:
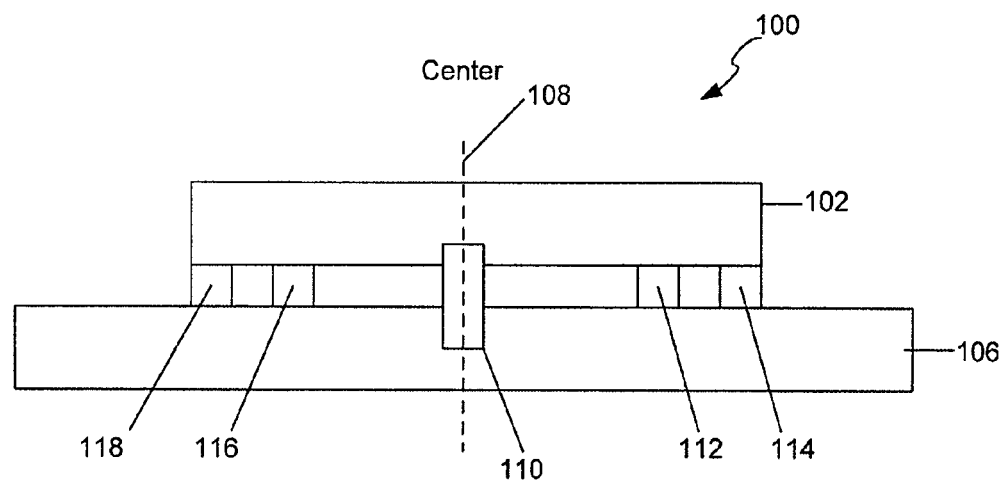
FIG. 1 illustrates a prior art system having a circuit board and housing held together by a floating fastener-based approach.

FIG. 1 illustrates system 100 comprised of circuit board 102 and enclosure 106. Circuit board 102 and enclosure 106 are held together using a floating fastener-based approach in accordance with the prior art.

In certain applications it was desirable to have center 108 of circuit board 102 aligned with the center of enclosure 106. To ensure that there was no relative movement along center 108 from thermal heat expansion, a fixed fastener 110 was coupled to circuit board 102 and housing 106 along the center axis 108. At no other point was a fixed fastener 110 coupled in order to preserve alignment along point 108 between circuit board 102 and housing 106.

Fixed fastener 110 disposed proximate center 108 of the enclosure 102, and circuit board 106 could be a screw or weld. Circuit board 102 and enclosure 106 are spaced apart by spacers 112, 114, 116 and 118 which surround the fixed fastener 110.

Figure 2:
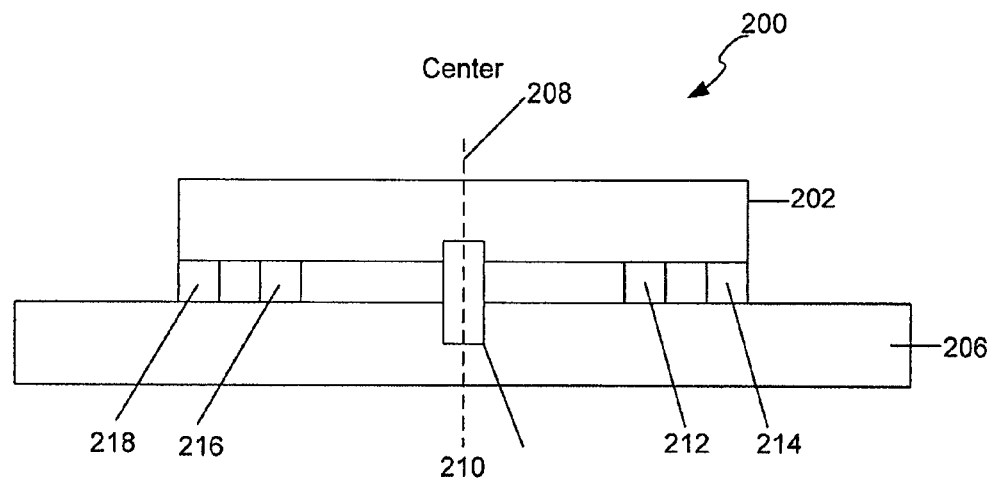
FIG. 2 illustrates a prior art system having a housing and circuit board held together by a floating fastener-based approach.

FIG. 2 illustrates a system 200 having a enclosure 206 and circuit board 202 held together by a prior art floating fastener-based approach. Circuit board 202 is fastened along the center axis 208 to enclosure 206 by fixed fastener 210. System 200 has undergone thermal expansion. While undergoing thermal expansion however, circuit board 202 rubbed against spacers 212, 214, 216, 218 causing friction. The friction can cause wear and debris between enclosure 206 and circuit board 202. The wear to circuit board 202 and the debris can hinder the overall performance of the device.

Figure 3:
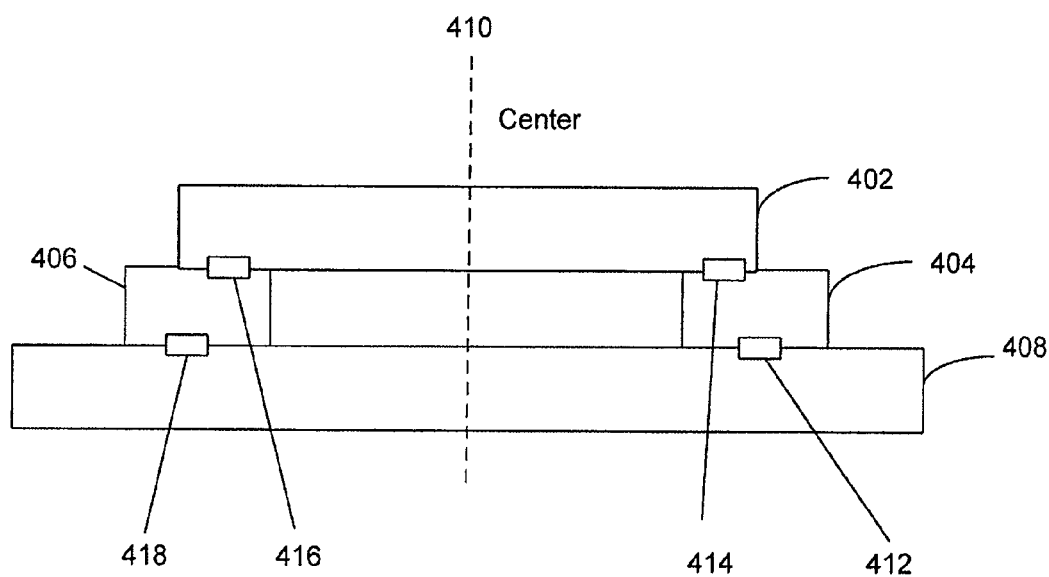
FIG. 3 illustrates a circuit board and housing system held together using at least one interposer in accordance with an embodiment of the present invention.

FIG. 3 illustrates circuit board 402 and enclosure 408 held together using interposers 406, 404 in accordance with an embodiment of the present invention. Interposers 404, 406 can comprise any suitable material and are placed between the circuit board 402 and enclosure 408. Circuit board 402 and housing 408 are aligned along the center axis 410. However, unless desired, interposers 404, 406 do not need to be placed along the center axis 410. Instead interposers 404, 406 can be placed around the center axis 410 to allow for a wide variety of coupling options.

Interposers 404, 406 are comprised of the same material and react to thermal heat expansion in substantially the same way as each other. Interposers 404, 406 are also substantially similar in size and shape.

Attachments 418, 416 couple interposer 406 to both the enclosure 408 and circuit board 402. Interposer 406 is fixedly coupled to circuit board 402 using attachment 416 and is also fixedly coupled to enclosure 408 using attachment 418. Similarly, interposer 404 is fixedly coupled to circuit board 402 using attachment 414 and is fixedly coupled to enclosure 408 using attachment 412.

Figure 4:
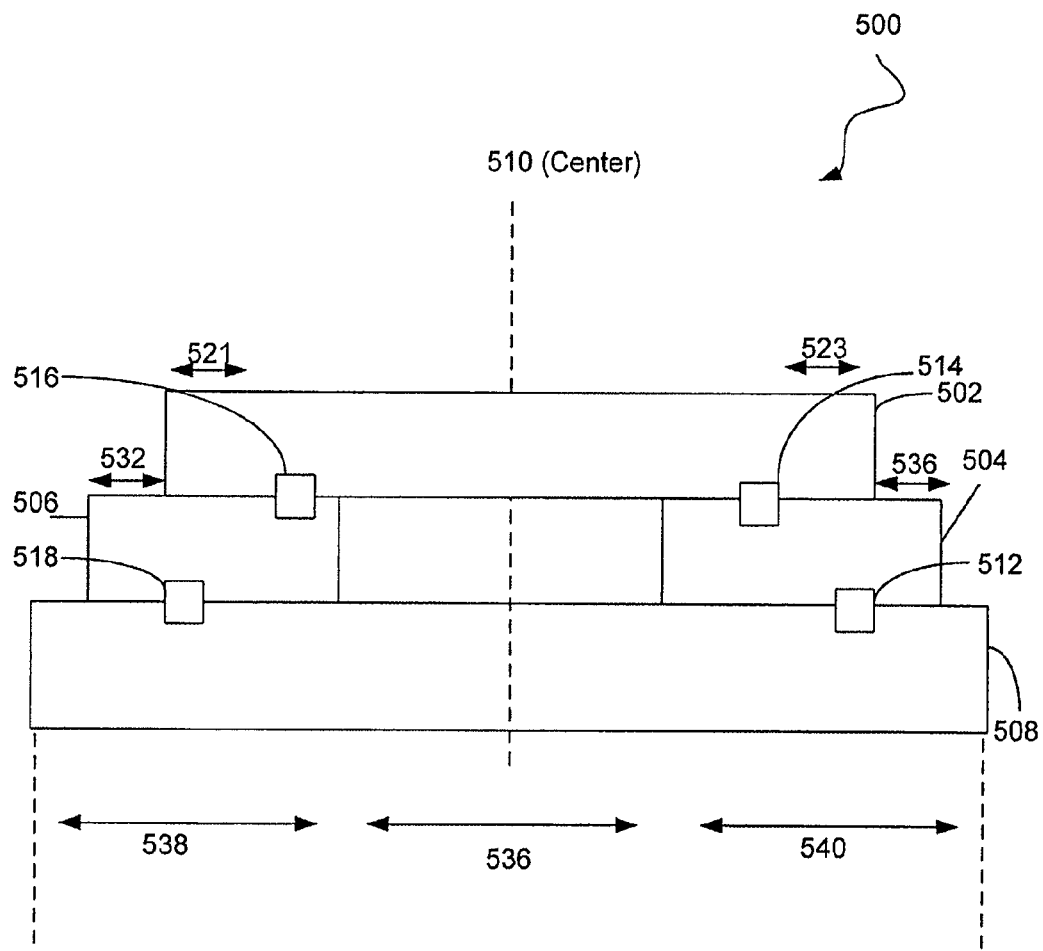
FIG. 4 illustrates a housing and circuit board system held together using interposers during expansion in accordance with an embodiment of the present invention.

FIG. 4 illustrates enclosure 502 and circuit board 508 held together using interposers 506, 504 in accordance with an embodiment of the present invention. System 500 has undergone thermal expansion. During thermal expansion, board 502 has increased from a length of x to a length of x'. Circuit board 502 has increased a total length increase of $\Delta x$.

Enclosure 508 has increased to a length y' from an original length y. Enclosure 508 has increased by 0.5 $\Delta y$ on a first side and by 0.5 $\Delta y$ on a second side. Thus, enclosure 508 has increased by a total length $\Delta y$ about the center axis 510.

Interposer 504 has also increased from an original length $z_1$ to length $z'_1$. Interposer 504 has increased by a length of $\Delta z_1$.

Similarly, interposer 506 has also increased from an original length $z_2$ to length $z'_2$. Interposer 506 has increased by a length of $\Delta z_2$. The increase in the interposers' 504, 506 lengths $\Delta z_1$ and $\Delta z_2$ are substantially similar.

Interposers 504, 506 thermal expansion $\Delta z_1$ and $\Delta z_2$, respectively, is substantially equal to the difference between housing 508 expansion $\Delta y$ and circuit board 502 expansion $\Delta x$. In the present embodiment this requires that interposer 504 expands by a length $\Delta z_1$.

$$\Delta z_1 = 0.5\Delta y - 0.5\Delta x$$

Similarly interposer 506 expands by length $\Delta z_2$:

$$\Delta z_2 = 0.5\Delta y - 0.5\Delta x$$

Figure 5:
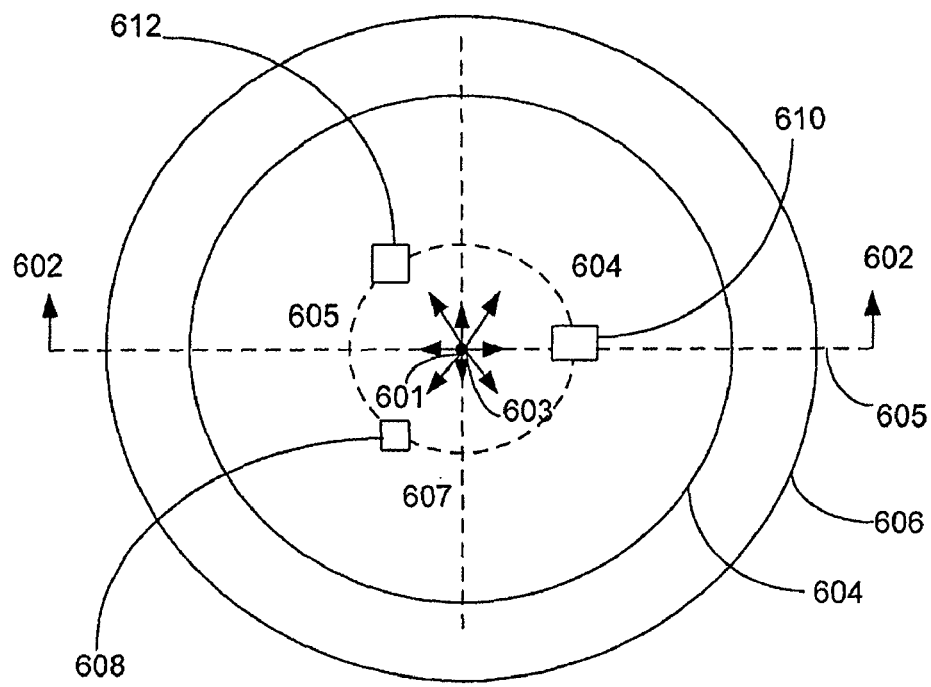
FIG. 5 illustrates a top view of a circuit board and housing system held together using interposers in accordance with an embodiment of the present invention.

FIG. 5 illustrates a top view of circuit board 604 and enclosure 606 held together using interposers 608, 610, 612 in accordance with an embodiment of the present invention. Interposers 608, 610, 612 are arranged at substantially even distances 605, 607, 609 from one another. Interposers 608, 610, 612 are preferably substantially the same distance from center 601. During thermal heat expansion circuit board 604 and enclosure 606 undergo expansion from center axis 601 in radial direction 603 outwards.

Figure 6:
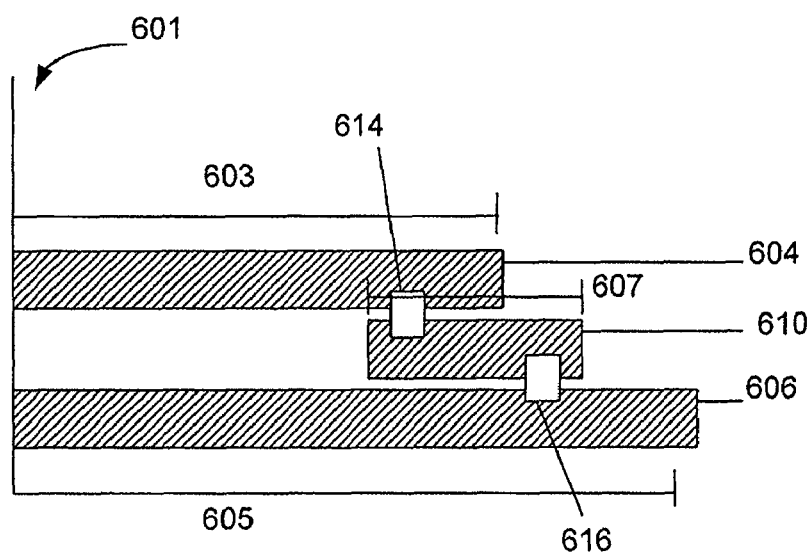
FIG. 6 illustrates a diagrammatic view of FIG. 5.

FIG. 6 illustrates a diagrammatic cut-out view along line 602. Circuit board 604 is coupled with interposer 610 using fastener 614. Similarly, housing 606 is coupled to interposer 610 using fastener 616. The interposer length, z, 607 can be determined from the CTE's and length, x 603, of enclosure 604. The interposer's CTE is equal to $\alpha_{int}$, the circuit board CTE is equal to $\alpha_{cb}$ and the housing CTE is equal to $\alpha_h$. Assuming $\alpha_{int}$ is greater than $\alpha_h$ which in turn is greater than $\alpha_{cb}$, the length, z, 607 of interposer 610 can be determined by the formula:

$$z = y^*(-\alpha_h + \alpha_{cb})/(\alpha_h - \alpha_{int})$$

The length 605 of enclosure 606 can also be determined using the lengths of circuit board 604 and interposer 610.

Although the present invention has been described with reference to preferred embodiments, workers skilled in the art will recognize that changes may be made in form and detail without departing from the spirit and scope of the invention.

What is claimed is:

1. A system comprising:
   a printed circuit board having a printed circuit board coefficient of thermal expansion;
   an enclosure for housing printed circuit board, the enclosure having an enclosure coefficient of thermal expansion different than the printed circuit board coefficient of thermal expansion;
   a plurality of linear interposers each having a first end fixedly coupled to the printed circuit board and a second end fixedly coupled to the enclosure; and
   wherein each linear interposer has a longitudinal axis that is substantially parallel to a plane of the printed circuit board, and wherein the first and second ends are spaced apart along the longitudinal axis.

2. The system of claim 1, wherein the plurality of linear interposers are arranged about a center axis of the circuit board.

3. The system of claim 1 wherein the plurality of linear interposers are arranged about a center axis of the enclosure.

4. The system of claim 1 wherein at least one linear interposer is made of a material having a higher coefficient of thermal expansion than the enclosure.

5. The system of claim 1 wherein at least one linear interposer is made of a material having a higher coefficient of thermal expansion than the circuit board.

6. The system of claim 1 wherein a length of each linear interposer along the longitudinal axis is a function of a length of the circuit board, a coefficient of thermal expansion (CTE) of the enclosure, a CTE of each linear interposer and a CTE of the circuit board.

7. The system of claim 1, wherein the circuit board is positioned within and substantially enclosed by the enclosure.

8. A system for maintaining a printed circuit board in an enclosure, the system comprising:
   a printed circuit board having a printed circuit board coefficient of thermal expansion;
   an enclosure that houses the circuit board the enclosure having an enclosure coefficient of thermal expansion that is different than the printed circuit board coefficient of thermal expansion; and
   a plurality of linear interposers each disposed between the circuit board and the enclosure each linear interposer having a longitudinal axis that is substantially parallel to the printed circuit board, wherein a first fastener attaches a first end of each linear interposer to the printed circuit board and a second fastener attaches a second end of each interposer to the enclosure, and wherein the first and second ends are spaced apart along the longitudinal axis.

9. The system of claim 8, wherein each linear interposer is disposed such that the enclosure and the printed circuit board maintain their alignment on at least one axis.

10. The system of claim 9, wherein at least one axis intersects the center of the printed circuit board and a center of the enclosure.

11. The system of claim 9, wherein the circuit board is positioned within and substantially enclosed by the enclosure.

12. The system of claim 8, wherein a length of each linear interposer is a function of a length of the printed circuit board, a CTE of the enclosure, a CTE of each linear interposer and a CTE of the printed circuit board.

* * * * *